(12) United States Patent
Dubey

(10) Patent No.: US 7,129,750 B2
(45) Date of Patent: Oct. 31, 2006

(54) CMOS TO PECL VOLTAGE LEVEL CONVERTER

(75) Inventor: Hari B. Dubey, Dt-Ghazipur (IN)

(73) Assignee: STMicroelectronics Pvt. Ltd., Noida (IN)

( * ) Notice: Subject to any disclaimer, the term of this patent is extended or adjusted under 35 U.S.C. 154(b) by 0 days.

(21) Appl. No.: 10/909,260

(22) Filed: Jul. 30, 2004

(65) Prior Publication Data
US 2005/0099206 A1 May 12, 2005

(30) Foreign Application Priority Data
Jul. 30, 2003 (IN) ........................... 945/DEL/2003

(51) Int. Cl.
| H03K 19/0175 | (2006.01) |
| H03K 19/082 | (2006.01) |
| H03K 3/42 | (2006.01) |
| H01L 35/00 | (2006.01) |
| H01L 37/00 | (2006.01) |

(52) U.S. Cl. ........................... 326/66; 326/77; 326/86; 327/512; 327/513

(58) Field of Classification Search ............... 326/66; 327/512, 513
See application file for complete search history.

(56) References Cited

U.S. PATENT DOCUMENTS

| 5,089,723 | A | * | 2/1992 | Davis et al. ................. 326/84 |
| 5,122,690 | A | * | 6/1992 | Bianchi ....................... 326/87 |
| 5,614,843 | A | * | 3/1997 | Mita et al. .................... 326/73 |
| 5,850,155 | A | * | 12/1998 | Matsumoto ................. 326/109 |
| 6,232,803 | B1 | * | 5/2001 | Nguyen ........................ 327/63 |
| 6,542,031 | B1 | * | 4/2003 | Kwong ........................ 330/253 |
| 6,924,660 | B1 | * | 8/2005 | Nguyen et al. ............... 326/30 |
| 2003/0085737 | A1 | * | 5/2003 | Tinsley et al. ............... 326/86 |

* cited by examiner

Primary Examiner—Rexford Barnie
Assistant Examiner—Dylan White
(74) Attorney, Agent, or Firm—Jenkens & Gilchrist, PC

(57) ABSTRACT

A CMOS to PECL voltage level converter includes a pad driver containing drive compensation circuitry and a feedback circuit for sensing the output drive level and providing control signals to the drive compensation circuitry for compensating for temperature and process variations while minimizing power consumption.

24 Claims, 3 Drawing Sheets

CMOS TO PECL VOLTAGE LEVEL CONVERTER

PRIORITY CLAIM

The present application claims priority from Indian Application for Patent No. 945/Del/2003 filed Jul. 30, 2003, the disclosure of which is hereby incorporated by reference.

BACKGROUND OF THE INVENTION

1. Technical Field of the Invention

The present invention relates to a voltage level converter for interfacing signals between different families of logic circuits. In particular, this invention relates to an improved voltage level converter for converting from Complimentary Metal Oxide Semiconductor (CMOS) to Positive Emitter Coupled Logic (PECL) logic levels, that is insensitive to process and temperature variations and has low power consumption.

2. Description of Related Art

Positive Emitter Coupled Logic (PECL) is used to transmit data at high speeds. PECL logic was initially implemented using bipolar devices. However these devices consumed a significant amount of power and this technology required a complex fabrication process. BICMOS devices were then introduced to improve speed and reduce power consumption. Subsequent advances in NMOS and CMOS technologies have made it possible to implement PECL in these technologies and further reduce power consumption and reduce cost. However, the logic levels of conventional CMOS logic devices and PECL logic devices are very different. This necessitates the use of special logic voltage level converters when interfacing between CMOS and PECL devices. The situation is further complicated by the increased propagation delay in the converter and lower signal fidelity of the CMOS circuitry. As PECL devices are essentially used in high-speed applications, use differential signals and operate with relatively small signal swings the voltage level converter must provide high switching speed and introduce minimal noise and signal skew. The situation is compounded by the fact that in a PECL device fabrication processes produce large variations in logic levels thereby adversely affecting the noise margin. Existing CMOS to PECL voltage level converter do not provide desired compensation for parameter variations arising out of process tolerances.

U.S. Pat. No. 5,633,602 describes a voltage converter for CMOS to PECL logic levels. This patent teaches a constant current source for providing an initial current to sustain a PECL low logic level. A voltage divider, coupled to the constant current source, stabilizes the initial current provided from the constant current source. A switchable constant current source provides an additional current to the initial current from the constant current source to sustain an ECL high logic level. A biasing means, coupled to the constant current source and the switchable constant current source, provides a voltage offset to the initial current from the constant current source and the additional current from the switchable current source. This arrangement consumes significant power owing to continuous current through the voltage divider. Also, a desired output voltage level variation tracking the supply voltage variations does not exist as in logic low state the gate to source voltage of the pull up transistor changes with voltage variation whereas its drain to source voltage remain constant. Since the compensation is particularly required when the output of the driver achieves a high logic level thus, the compensation provided by the constant current is not very effective owing to output voltage variations as a result of process parameter spreads and temperature. A further disadvantage is that the switchable constant current source (source follower) needs to be sized larger than the constant current source (pull up transistor) to achieve an adequate high logic level, resulting in increased area.

SUMMARY OF THE INVENTION

A need exists for a low-voltage CMOS to PECL level converter that compensates for the effects of process spreads and temperature variations.

A need further exists for a CMOS to PECL voltage level converter that has low power consumption.

To address the foregoing and other needs, embodiments of the present invention provide an improved CMOS to PECL voltage level converter that provides compensation for process and temperature variations while minimizing power consumption. This converter includes a pad driver containing drive compensation circuitry receiving a first and second set of voltage inputs and providing the converted complementary voltage level outputs, said first set of inputs being complementary input CMOS logic levels. The converter further includes a feedback circuit connected between the outputs and said second set of inputs of the pad driver, for sensing the output drive level and providing control signals to said drive compensation circuitry for compensating for temperature and process variations.

In one implementation, the drive compensation circuitry includes at least two controlled drive sources of different drive levels each of which provides a predetermined drive to correct the output voltage.

In one implementation, the feedback circuit includes a selection means for selecting either said first input or the output of the pad driver as the control signal to the pad driver for adjusting its output voltage to the desired voltage level.

An embodiment of the invention further provides a method for improving a CMOS to PECL voltage level converter to provide compensation for process spreads and temperature variations, while maintaining low power consumption. In accordance with the method, the output voltage level is sensed. The output drive is then compensated to correct for temperature and process variations.

In one implementation, the drive compensation is achieved by enabling one or more selected drive sources of differing drive levels.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
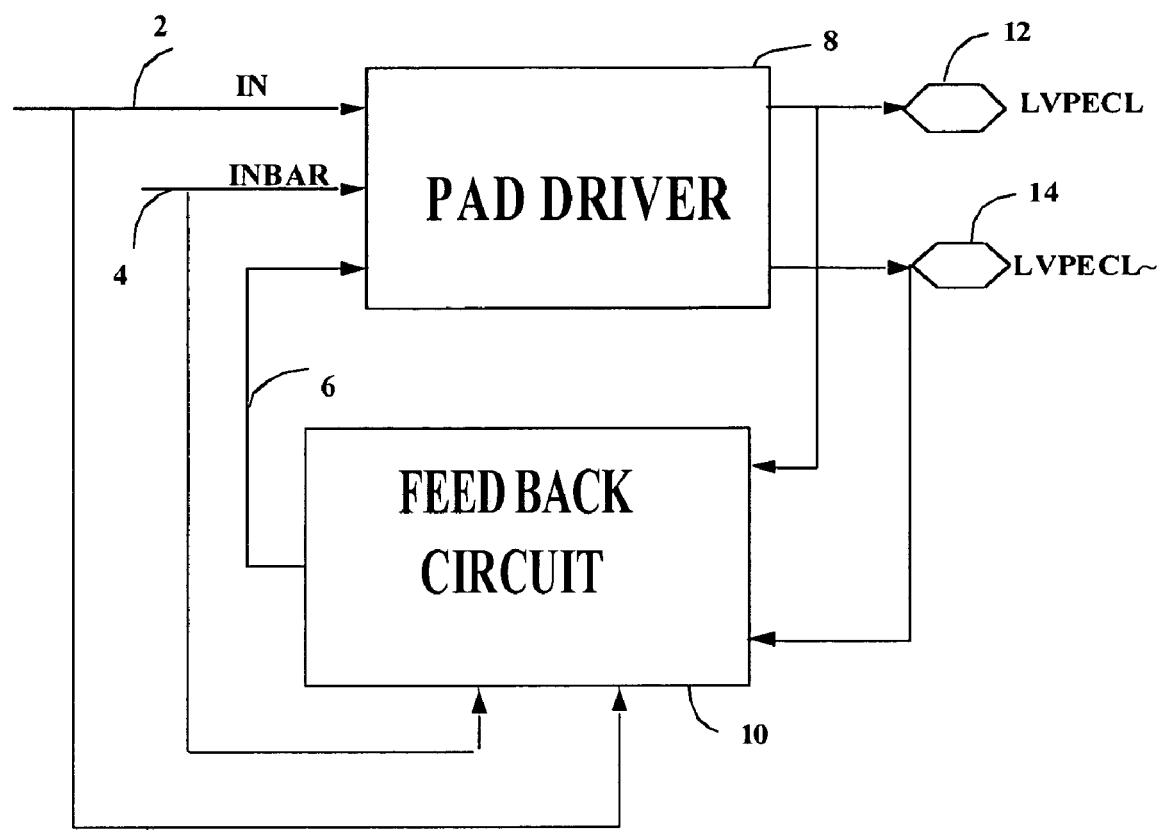
FIG. 1 is a simplified block diagram of a low voltage PECL buffer according to this invention.

FIG. 1 is a simplified block diagram of a CMOS to PECL voltage level converter according to an embodiment of the invention. The converter includes a pad driver 8 and a feedback circuit 10. The pad driver circuitry 8 provides a particular DC level and operates the converter at the highest possible operating frequency with minimum jitter. Feedback circuit 10 makes the DC levels process and temperature independent. The feedback circuit 10 provides a control signal 6 to the pad driver 8. LVPECL pad 12 and LVPECL~ pad 14 provide two complementary output signals complying with PECL specifications.

Figure 2:
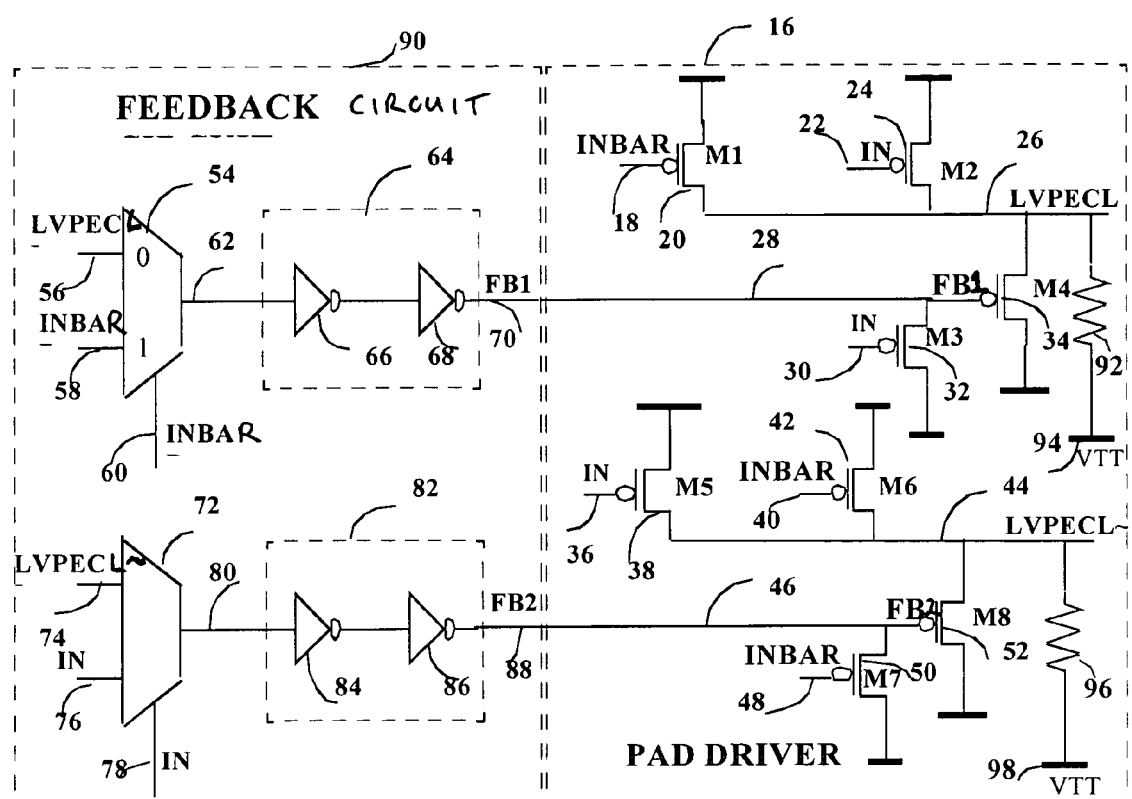
FIG. 2 is a schematic diagram of a low voltage PECL buffer with feedback.

FIG. 2 shows a circuit diagram of an embodiment of the CMOS to PECL voltage level converter. The converter comprises a pad driver circuit 16 and a feedback circuit 90. Signal IN is the input signal to the pad driver. Signal INBAR is the complementary data to the driver, which is obtained by inverting the IN signal. Transistors M1, M2 and M4 drive the pad LVPECL 26 and transistors M5, M6 and M8 drive the complementary pad LVPECL~ 44. Transistors M3 and M7 are used to turn off transistors M4 and M8, respectively, whenever the corresponding PAD attains the required PECL low logic level. During normal feedback operation, these transistors remain off. Transistors M1 and M5 are sized to attain the high-level logic of low voltage PECL. M2 and M6 are similarly sized. Transistors M4 and M8 are controlled by feedback signals FB1 28 and FB2 46, respectively.

The feedback circuit is designed to function such that transistors M4 and M8 turn on only when there is a logic high level at pads LVPECL 26 and LVPECL~ 44, respectively. Whenever data signal IN goes low, nodes 18 and 40 get a high voltage level and nodes 22 and 36 get a low voltage level. Transistor M1 20 turns off and transistor M2 24 turns on, thereby pulling pad LVPECL 26 to the logic low level of PECL logic when pad LVPECL is connected to a resistor 92 of about 50 ohms whose other end is connected to a termination voltage VTT 94. Under typical conditions, VTT 94 holds a voltage of 1.3 V. At the same time, transistor M5 38 turns on and transistor M6 42 turns off, thereby pulling up the pad LVPECL~ to the logic high voltage of PECL logic when pad LVPECL 26 is connected to a resistor 96 of about 50 ohms whose other end is connected to a termination voltage VTT 98. Whenever the IN signal is raised to a high voltage level, node 18 receives a low voltage level and node 22 receives a high voltage level. Transistor 20 turns on and transistor 24 turns off pulling pad LVPECL 26 up to the logic high voltage of PECL logic. At the same time, transistor 38 turns off and transistor 42 turns on, thereby pulling pad LVPECL~ 44 down to the logic low voltage of PECL logic. To achieve the minimum phase mismatch between complementary signals LVPECL and LVPECL~, signal IN and signal INBAR need to have minimum phase mismatch. The sizing of transistors M3 and M7 is also important for getting minimum skew between the two complementary signals as these control the turn off of transistors M4 and M8 that are used for driving pads LVPECL 26 and LVPECL 44, respectively.

The feedback circuit block 90 provides two signals FB1 70 and FB2 88 to control transistors M4 and M8, to achieve the desired logic level at pads LVPECL 26 and LVPECL~ 44, respectively. Whenever signal IN goes low, pads LVPECL and LVPECL~ achieve low logic level and high logic level of PECL logic, respectively. Under these conditions, multiplexer 54 passes signal INBAR 58 (i.e., 3.3 V) at node 62 which in turn is passed on to node FB1 70 through buffer 64. This turns transistor M4 off. Since this turn off of the transistor M4 involves a delay from multiplexer 54 through a buffer 64, circuit performance degrades. To compensate for this, transistor M3 connected to node FB1 28 provides 3.3 V to this node whenever signal INBAR goes high. Multiplexer 72 transfers the high logic level of LVPECL~ 74 to node 80. Since LVPECL~ 74 achieves lower voltage at worst process corners, the trip-point of buffer 82 is adjusted such that it transfers 0 V to node FB2 88 at the worst process corners and transfers 3.3 V at the best process corners. Thus, pad driver p-channel transistor M8 turns on at worst process corners and turns off at best process corners thereby enhancing the voltage level at the pad LVPECL~ 44 at the worst process corners while remaining dormant at the best process corners. In this manner, the feedback circuit minimizes the difference of DC levels at pad LVPECL~ for the high logic level.

When signal IN goes high, pad LVPECL 26 and pad LVPECL~ 44 attain the high logic level and low logic level of low voltage PECL, respectively. Under these conditions, multiplexer 72 connects signal IN 76 (i.e., 3.3 V) to node 80 which in turn transfers this level to node FB2 88 through buffer 82. This turns off transistor M8. Since this turn off of the transistor M8 involves a delay from multiplexer 72 and buffer 82, the speed of the circuit degrades. This is compensated by transistor M7 connected to node FB2 46 which transfers 3.3 V to this node whenever signal IN goes high. Multiplexer 54 connects the high logic level of LVPECL to node 62. Since LVPECL achieves lower voltage at worst process corners, the trip-point of buffer 64 is adjusted such that it transfers 0 V to node FB1 70 at worst process corners and transfers 3.3 V to it at the best corners. Pad driver p-channel transistor M4 turns on at worst process corners and turns off at best process corners. Thus, the voltage level at the pad LVPECL gets enhanced at worst process corners and remains unaffected at best process corners.

Buffer 64 contains inverter 66 and 68. Similarly, buffer 82 contains inverter 84 and 86. In this manner, the feedback circuit minimizes the difference of DC levels at pad LVPECL 26 and pad LVPECL~ 44.

It will also be apparent that process compensation is not required whenever any of the two pads is driven to the low logic level of low voltage PECL. Jitter gets minimized which improves the eye diagram. Since a pad always has significant parasitics and the pad voltage is being fed back to buffers 64 and 82, the trip-point adjustment of the buffers is critical.

Figure 3:
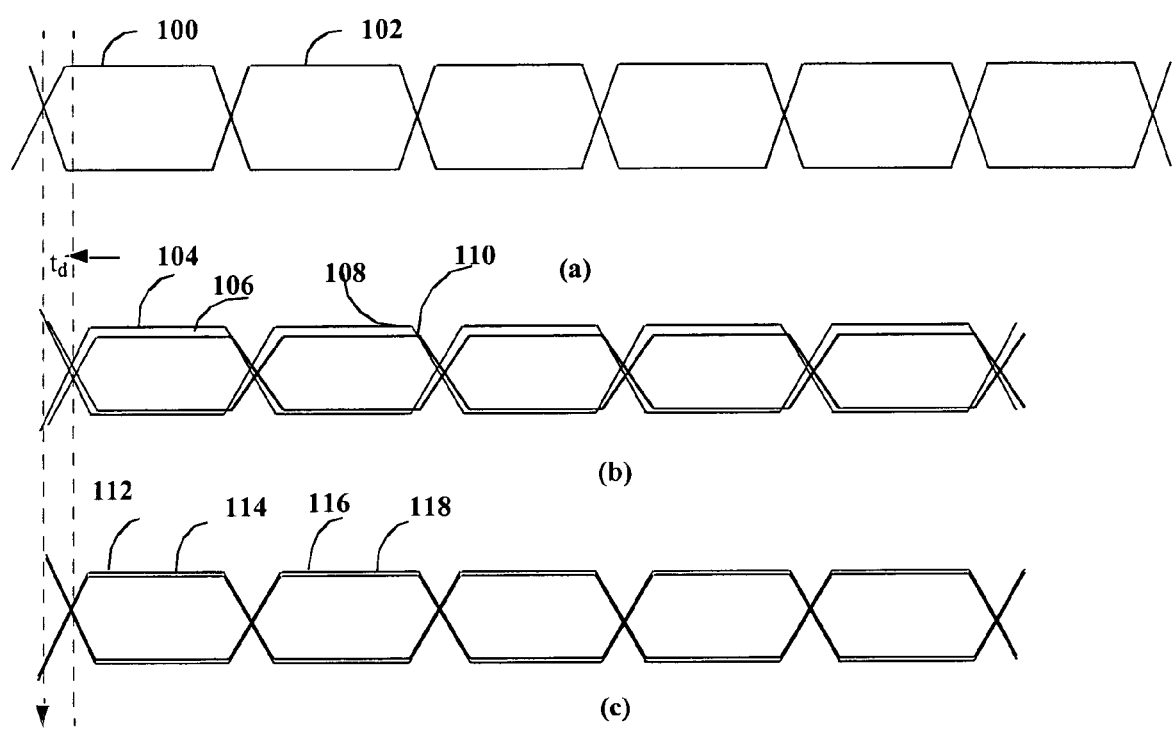
FIGS. 3A–3C are waveform diagrams highlighting operation of the buffer with and without the compensation circuit.

FIGS. 3A–3C depict the effect of the compensation circuit. In FIG. 3A, references 100 and 102 show the two complementary input signals IN and INBAR, respectively. FIG. 3B shows the output waveforms without the use of the process compensation feedback. References 104 and 110 are the two complementary signals at the pads LVPECL and LVPECL~, respectively at best process corners. Similarly, references 106 and 108 are the two complementary signals when the circuit is simulated at worst process corners. It can be seen from the illustration that difference in high level of PECL logic at extreme process corners is large. FIG. 3C shows the output waveforms when the feedback circuit is used. References 112 and 118 are the two complementary signals at the pads LVPECL and LVPECL~, respectively at best process corners. Similarly, references 114 and 116 are the two complementary signals at worst process corners. It can be observed that the difference in high level of PECL logic at extreme process corners has been compensated and resulting in reduced delay td between the application of the input and the outputting of data at the pads. It can also be observed that the compensation required for temperature variation is also provided by the feedback circuit. Since the compensation uses positive feedback, there is a possibility for the circuit to become unstable and lead to oscillations. However the overall gain of the circuit in most operating conditions is small, as a result any oscillations damp out rapidly without adversely affecting the overall performance. Furthermore, since the circuit is intended for high frequency operation, the additional delay provided by the feedback circuit coupled with the parasitics of the pad itself, dampen any oscillations present without compromising the operation of the circuit. The inclusion of the process compensation circuit also increases the noise margin of the device as the difference of low and high logic level effectively increases.

It will be apparent to those with ordinary skill in the art that the foregoing is merely illustrative and not intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

What is claimed is:

1. A CMOS to PECL voltage level converter that provides compensation for process and temperature variations while minimizing power consumption, comprising:
   a pad driver containing drive compensation circuitry receiving a first and second set of voltage inputs and providing converted complementary voltage level outputs, said first set of inputs being complementary input CMOS logic levels; and
   a feedback circuit connected between the converted complementary voltage level outputs and the second set of inputs of the pad driver, for sensing an output drive level and providing control signals to said drive compensation circuitry to compensate for temperature and process variations.

2. The converter of claim 1 wherein said drive compensation circuitry includes at least two controlled drive sources of different drive levels each of which provides a predetermined drive to correct the output voltage.

3. The converter of claim 1 wherein said feedback circuit includes means for selecting either said first input or the output of the pad driver as the control signal to the pad driver for adjusting its output voltage to the desired voltage level.

4. A method for CMOS to PECL voltage level conversion so as to provide compensation for process spreads and temperature variations, while maintaining low power consumption, comprising:
   sensing an output PECL voltage level; and
   compensating an output drive producing the output PECL voltage level based on the sensed output PECL voltage level to correct for temperature and process variations.

5. The method of claim 4 wherein compensating is achieved by enabling one or more selected drive sources of differing drive levels.

6. A CMOS to PECL converter, comprising:
   a pad driver circuit including:
      a PECL pad driver circuit receiving complementary CMOS input signals and a first feedback signal;
      a complementary PECL pad driver circuit also receiving the complementary CMOS input signals and a second feedback signal; and
   a feedback circuit including:
      a first feedback path originating at the PECL pad to selectively apply a logic level of the PECL pad as the first feedback signal; and
      a second feedback path originating at the complementary PECL pad to selectively apply a logic level of the complementary PECL pad as the second feedback signal.

7. The converter of claim 6 wherein the first feedback path selectively applies the logic level of the PECL pad as the first feedback signal responsive to a first one of the CMOS input signals.

8. The converter of claim 7 wherein the second feedback path selectively applies the logic level of the complementary PECL pad as the second feedback signal responsive to a second one of the CMOS input signals.

9. The converter of claim 8 wherein the second feedback path alternatively selectively applies the logic level of the second one of the CMOS input signals as the second feedback signal.

10. The converter of claim 7 wherein the first feedback path alternatively selectively applies the logic level of the first one of the CMOS input signals as the first feedback signal.

11. The converter of claim 6 wherein the first feedback signal is selectively tied to a reference voltage responsive to a first one of the CMOS input signals.

12. The converter of claim 11 wherein the second feedback signal is selectively tied to a reference voltage responsive to a second one of the CMOS input signals.

13. The converter of claim 6 wherein each of the first and second feedback signals are delayed by respective buffer circuits.

14. The converter of claim 6 wherein each of the first and second feedback signals are generated by respective multiplexer circuits to selectively apply PECL logic levels.

15. A CMOS to PECL voltage level converter, comprising:
   a pad driver having complementary first and second CMOS inputs and complementary first and second PECL outputs, the CMOS inputs coupled to the PECL outputs through a differential drive compensation circuit that converts CMOS voltage levels to PECL voltage levels; and
   a feedback circuit that senses the PECL outputs and generates, responsive to the complementary first and second CMOS inputs, a control signal applied to the pad driver differential drive compensation circuit to compensate for temperature and process variations.

16. The converter of claim 15 wherein the differential drive compensation circuit includes first and second controlled drive sources of different drive levels each of which providing a predetermined drive responsive to the control signal so as to product correct PECL voltages.

17. The converter of claim 15 wherein the feedback circuit comprises a switching circuit that selects either a PECL output or a CMOS input as the control signal.

18. The converter of claim 17 wherein the pad driver responds to the PECL output/CMOS input feedback control signal by adjusting its output voltage to a desired PECL voltage level.

19. A CMOS to PECL voltage level converter, comprising:
   a pair of CMOS inputs for receiving complementary CMOS signals;
   a pair of PECL outputs for producing PECL signals;
   a first multiplexer receiving one of the complementary CMOS signals and one of the PECL signals;
   a second multiplexer receiving another of the complementary CMOS signals and another of the PECL signals;

a first MOS transistor source/drain circuit connected to one of the PECL outputs and having a gate terminal coupled to receive an output of the first multiplexer; and a second MOS transistor source/drain circuit connected to another of the PECL outputs and having a gate terminal coupled to receive an output of the second multiplexer.

20. The converter of claim 19 wherein:

the first multiplexer includes a selection terminal coupled to receive one of the complementary CMOS signals; and the second multiplexer includes a selection terminal coupled to receive another of the complementary CMOS signals.

21. The converter of claim 19 further comprising:

a first buffer between an output of the first multiplexer and the gate of the first MOS transistor; and a second buffer between an output of the second multiplexer and the gate of the second MOS transistor.

22. The converter of claim 19 further including:

a first resistance coupled between one of the PECL outputs and a reference voltage; and a second resistance coupled between another of the PECL outputs and the reference voltage.

23. The converter of claim 19 further including:

first selectively actuated drive transistors source/drain circuit coupled to one of the PECL outputs and selectively actuated by the received complementary CMOS signals; and second selectively actuated drive transistors source/drain circuit coupled to another of the PECL outputs and selectively actuated by the received complementary CMOS signals.

24. The converter of claim 19 further including:

a first pull down transistor source/drain circuit coupled to the gate of the first MOS transistor and gate connected to receive another of the complementary CMOS signals; and a second pull down transistor source/drain circuit coupled to the gate of the second MOS transistor and gate connected to receive one of the complementary CMOS signals.

* * * * *